(12) United States Patent
Mori et al.

(10) Patent No.: US 7,152,316 B2
(45) Date of Patent: Dec. 26, 2006

(54) HYBRID INTEGRATED CIRCUIT DEVICE AND METHOD OF MANUFACTURING THE SAME

(75) Inventors: Haruhiko Mori, Gunma (JP); Masaru Kanakubo, Gunma (JP); Hideyuki Sakamoto, Gunma (JP)

(73) Assignees: Sanyo Electric Co., Ltd., Osaka (JP); Kanto Sanyo Semiconductors Co., Ltd., Gunma (JP)

( * ) Notice: Subject to any disclaimer, the term of this patent is extended or adjusted under 35 U.S.C. 154(b) by 0 days.

(21) Appl. No.: 10/905,259

(22) Filed: Dec. 22, 2004

(65) Prior Publication Data

US 2005/0161251 A1 Jul. 28, 2005

(30) Foreign Application Priority Data

Dec. 24, 2003 (JP) .............................. 2003-428409

(51) Int. Cl.
*H05K 3/30* (2006.01)
(52) U.S. Cl. ............................. 29/841; 29/825; 29/827; 29/832; 29/840; 264/272.15
(58) Field of Classification Search ........... 264/272.15; 29/825, 827, 832, 840, 841
See application file for complete search history.

(56) References Cited

U.S. PATENT DOCUMENTS

| 4,079,511 | A | * | 3/1978 | Grabbe ......................... 29/827 |
| 4,300,153 | A | * | 11/1981 | Hayakawa et al. ......... 257/668 |
| 4,330,790 | A | * | 5/1982 | Burns ........................ 257/671 |
| 4,701,999 | A | * | 10/1987 | Palmer ......................... 29/827 |
| 4,746,392 | A | * | 5/1988 | Hoppe .................... 156/244.12 |
| 4,829,666 | A | * | 5/1989 | Haghiri-Tehrani et al. .... 29/841 |
| 4,855,868 | A | * | 8/1989 | Harding ...................... 361/723 |
| 4,897,534 | A | * | 1/1990 | Haghiri-Tehrani .......... 235/488 |
| 5,013,900 | A | * | 5/1991 | Hoppe ........................ 235/492 |
| 6,085,412 | A | * | 7/2000 | Iwasaki ....................... 29/827 |
| 6,214,640 | B1 | * | 4/2001 | Fosberry et al. ............ 438/106 |
| 6,403,009 | B1 | * | 6/2002 | Saxelby et al. ......... 264/272.15 |
| 2003/0001255 | A1 | | 1/2003 | Limura et al. |

FOREIGN PATENT DOCUMENTS

JP 04-007866 1/1992
JP 6-177295 6/1994

* cited by examiner

*Primary Examiner*—Carl J. Arbes
(74) *Attorney, Agent, or Firm*—Watchstone P+D, plc; Stephen B. Parker, Esq.

(57) ABSTRACT

To provide a hybrid integrated circuit device in which the rear surface of a circuit board is exposed to the outside and a method of manufacturing the same. Here, leads are fixed to the surface of the circuit board along one side thereof. A method of manufacturing a hybrid integrated circuit device includes the steps of forming an electric circuit which includes a conductive pattern formed on a surface of a circuit board and a circuit element electrically connected to the conductive pattern, fixing a lead to a pad formed of the conductive pattern, housing the circuit board in a cavity of molds, and fixedly supporting the lead by clamping the lead between the molds, and performing sealing by filling inside of the cavity with sealing resin with the rear surface of the circuit board made in contact with an inside bottom surface of the molds.

7 Claims, 11 Drawing Sheets

HYBRID INTEGRATED CIRCUIT DEVICE AND METHOD OF MANUFACTURING THE SAME

CROSS-REFERENCE TO RELATED APPLICATIONS

Priority is claimed to Japanese Patent Application Number JP2003-428409 filed on Dec. 24, 2003, the disclosure of which is incorporated herein by reference in its entirety.

FIELD OF THE INVENTION

The present invention relates to a hybrid integrated circuit device and a method of manufacturing the same. More particularly, the present invention relates to a hybrid integrated circuit device in which the rear surface of a circuit board is exposed out of sealing resin, and a method of manufacturing the same.

DESCRIPTION OF THE RELATED ART

The configuration of a conventional hybrid integrated circuit device will be described with reference to FIG. 10 (See Patent Document 1, for example). FIG. 10A is a perspective view of a hybrid integrated circuit device 100. FIG. 10B is a cross-sectional view of the hybrid integrated circuit device 100 taken along the X–X' line in FIG. 10A.

Referring to FIGS. 10A and 10B, here, the conventional hybrid integrated circuit device 100 includes the following configuration. Specifically, the hybrid integrated circuit device 100 includes: a rectangular circuit board 106; a conductive pattern 108 formed on an insulating layer 107 which is provided on the surface of the circuit board 106; a circuit element 104 fixed onto the conductive pattern 108; a metal wire 105 which electrically connects the circuit element 104 to the conductive pattern 108; and a lead 101 electrically connected to the conductive pattern 108. As described above, the entire of the hybrid integrated circuit device 100 is sealed with sealing resin 102. As a method of sealing the device with the sealing resin 102, injection molding employing thermoplastic resin and transfer molding employing thermosetting resin can be cited.

Referring to FIG. 11, a description will be given of steps of performing resin sealing by use of transfer molding. FIG. 11 is a cross-sectional view showing a state where resin sealing is performed by use of molds 110.

An electric circuit including the circuit element 104 and the like is formed on the surface of the circuit board 106. The circuit board 106 is fixed by means of upper and lower molds 110A and 110B. By interlocking upper and lower molds 110A and 110B, a cavity that is a space to be filled with resin is formed. Sealing resin is injected through a gate 111 and thus the circuit board 106 is sealed. Further, the upper and lower molds 110A and 110B support a lead frame 101A by clamping the lead frame 101A therebetween. In this way, the planar position of the circuit board 106 is fixed. Furthermore, the upper mold 110A is provided with a pressing pin P extending downward therefrom. This pressing pin P presses the surface of the circuit board 106 and thereby, in the sealing step, the position of the circuit board 106 is fixed in the thickness direction.

The circuit board 106 is sealed through the above-described steps, and after curing and the like for stabilizing the property of thermosetting resin is subsequently performed. In this way, the hybrid integrated circuit device is finished as a product.

(Patent Document 1) Japanese Unexamined Patent Publication No. Hei 06-177295 (page 4, FIG. 1)

However, the above-described method of manufacturing a hybrid integrated circuit device has following problems.

A region on which the pressing pin P abuts needs to be provided on the circuit board 106. For this reason, this dead space region has been preventing the miniaturization of the board. In addition, a circuit element such as a transistor cannot be mounted on the region on which the pressing pin P abuts. Accordingly, there has been a problem of flexibility in designing the conductive pattern 108 being unfavorably reduced. Moreover, there has been a problem of voids being generated because the fluidity of the sealing resin is reduced around the pressing pin.

The method of sealing the entire, including the rear surface, of the board has been described above. For enhanced heat dissipation property, however, the rear surface of the circuit board 106 is exposed out of the sealing resin 102 in some cases. In such a case, when the pressing pin P is employed, it has been very difficult to allow the tip of the pressing pin P to precisely come into contact with the surface of the circuit board 106. This is attributed to the fact that there is some degree of tolerance in the thickness of the circuit board 106. For this reason, there has been a problem of the surface of the circuit board 106 being damaged due to the pressing pin P excessively pressing the circuit board 106. Damage to insulating resin which is formed on the surface of the circuit board 106 results in unfavorable reduction in the pressure resistance of the circuit board 106.

SUMMARY OF THE INVENTION

The present invention has been achieved in light of the above-described problems. Accordingly, the present invention provides a hybrid integrated circuit device in which the rear surface of a circuit board is exposed to the outside and a method of manufacturing the same. Here, leads are fixed to the surface of the circuit board along one side thereof.

A hybrid integrated circuit device of the present invention includes: a circuit board; a conductive pattern formed on a surface of the circuit board; a circuit element electrically connected to the conductive pattern; a lead fixed to a pad formed of the conductive pattern; and sealing resin formed so as to at least cover the surface of the circuit board. A rear surface of the pad is separated from the surface of the circuit board.

Moreover, in the hybrid integrated circuit device of the present invention, the pad is formed on a surface of an insulating layer for covering the circuit board, and the pad is separated from the insulating layer.

Furthermore, in the hybrid integrated circuit device of the present invention, the lead is partially covered with the sealing resin and is thereby supported mechanically.

A method of manufacturing a hybrid integrated circuit device of the present invention includes the steps of: forming an electric circuit which includes a conductive pattern formed on a surface of a circuit board and a circuit element electrically connected to the conductive pattern; fixing a lead to a pad formed of the conductive pattern; housing the circuit board in a cavity of molds, and fixedly supporting the lead by clamping the lead between the molds; and performing sealing by filling inside of the cavity with sealing resin with the rear surface of the circuit board made in contact with an inside bottom surface of the molds.

Further, in the present invention, in the step of fixing the lead, the lead is supported by clamping the lead between the molds and thereby the circuit board is fixed in a direction oblique with respect to the bottom surface of the molds, and the weight of the sealing resin is used to allow the rear surface of the circuit board to come in contact with the inside bottom surface of the molds.

Moreover, in the present invention, a rear surface of the pad is bonded to the circuit board via a first adhesive, the lead is bonded to a surface of the pad via a second adhesive which has a higher bonding strength than that of the first adhesive, and the weight of the sealing resin is used to allow the rear surface of the circuit board to come in contact with the inside bottom surface of the molds, and thereby the rear surface of the pad is separated from the circuit board in a state where the surface of the pad is bonded to the lead. For the above-described first adhesive, a resin layer made of a resin, for example, can be adopted. In addition, a brazing material such as solder can be adopted as for the above-described second adhesive.

Still further, in the present invention, the first adhesive is an adhesive having insulating properties, and the second adhesive is a conductive adhesive.

In addition, in the present invention, the first adhesive is an adhesive which includes a resin, and the second adhesive is an adhesive which is made of metal.

Additionally, the present invention includes: the first adhesive for bonding the rear surface of the pad to the circuit board is made of a material which softens up at temperature lower than that of the molds when the sealing is performed; the circuit board is placed inside the molds, thereby leading to the softening up of the first adhesive, and the bonding strength of the first adhesive is reduced; and the weight of the sealing resin is used to allow the rear surface of the circuit board to come in contact with the inside bottom surface of the molds, and thereby the rear surface of the pad is separated from the circuit board in a state where the surface of the pad is bonded to the lead.

Besides, in the present invention, the first adhesive is an adhesive which includes a resin.

Furthermore, the present invention is characterized in that the sealing resin is filled in a gap between the separated pad and the circuit board.

The following effects can be brought about according to the present invention.

The pads to which the leads are connected are separated from the surface of the circuit board. In this way, the pads and leads are covered by the sealing resin in a state where stress is not generated in a gap between the leads and the circuit board. Accordingly, the connection reliability between the leads and the pads is increased.

In the step of resin sealing, the sealing resin itself to be filled in the cavity is used to allow the circuit board to come into contact with the inside bottom surface of the molds. Accordingly, it is possible to remove such an additional structure as pressing pin P shown in conventional example and to perform sealing step. In addition, a region on which the pressing pin P abuts is not required to be provided on the surface of the circuit board. For this reason, the conductive pattern can be formed on substantially the entire surface of the circuit board. Furthermore, the position onto which a circuit element such as a transistor is mounted is not limited. Accordingly, flexibility in designing a conductive pattern and the position onto which the circuit element is mounted and the like can be increased.

Moreover, stress acting on the leads is alleviated even when there is unevenness in the thickness of the circuit board, in the thickness of the adhesives which connect the circuit board and the leads, and in the thickness of the leads. This is because a gap is formed between the pad to which the lead is fixed and the surface of the circuit board, and stress is absorbed in this gap even when the above-described unevenness is generated.

DETAILED DESCRIPTION OF THE PREFERRED EMBODIMENT

Figure 1A:
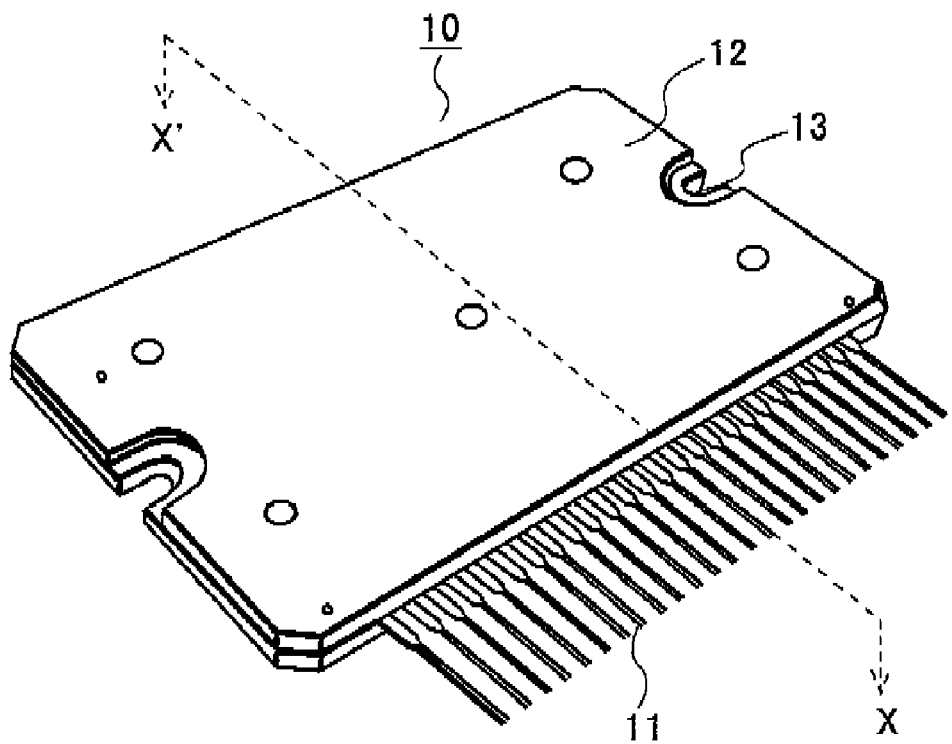
FIG. 1A is a perspective view and FIG. 1B is a cross-sectional view of a hybrid integrated circuit device of the preferred embodiment.
Figure 1B:
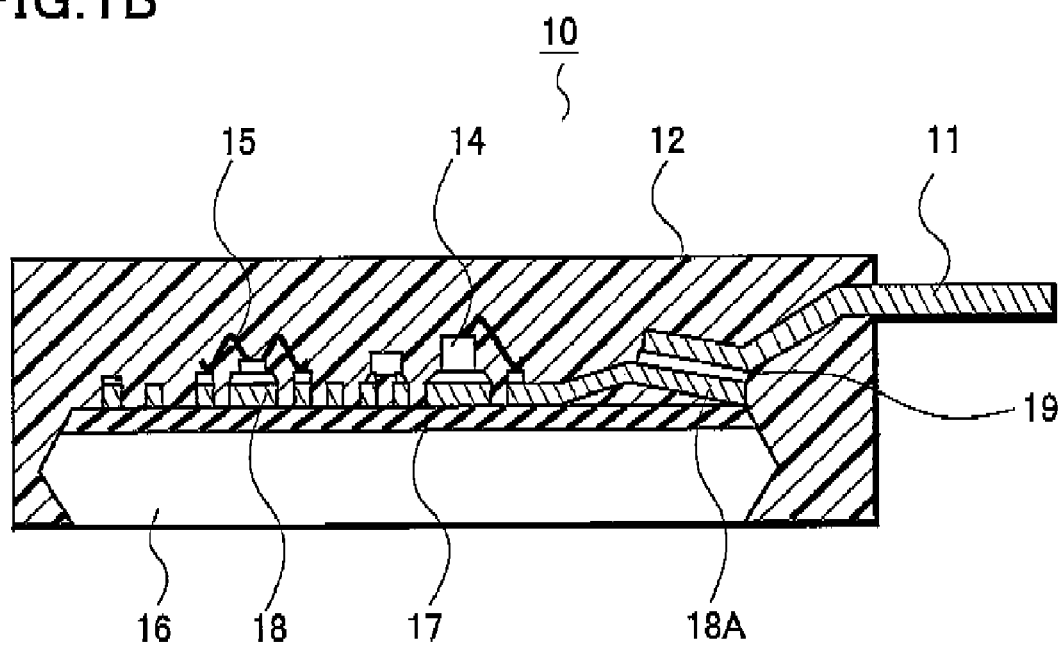

Referring to FIGS. 1A and 1B, the configuration of a hybrid integrated circuit device 10 according to the preferred embodiment of the present invention will be described. FIG. 1A is a perspective view of the hybrid integrated circuit device 10. FIG. 1B is a cross-sectional view of the hybrid integrated circuit device 10, which is taken along the X–X' line in FIG. 1A.

The hybrid integrated circuit device 10 according to the preferred embodiment of the present invention includes: a circuit board 16 on the surface of which an electric circuit including a conductive pattern 18 and a circuit element 14 is formed; and sealing resin 12 which seals the electric circuit and at least covers the surface of the circuit board 16. Hereinafter, the respective constituent components will be described.

The circuit board 16 is a board made of metal such as aluminum and copper. When a board made of aluminum is adopted as the circuit board 16 by way of an example, there are two methods of insulating the circuit board 16 from the conductive pattern 18 formed on the surface thereof: one is a method of anodizing the surface of the aluminum board; the other one is a method of forming an insulating layer 17 on a surface of the aluminum board, and forming the conductive pattern 18 on a surface of the insulating layer 17.

Here, the rear surface of the circuit board 16 is exposed out of the sealing resin 12 in order to effectively dissipate heat generated in the circuit element 14 mounted on the surface of the circuit board 16.

The circuit element 14 is fixed onto the conductive pattern 18. The circuit element 14 and the conductive pattern 18 form a predetermined electric circuit. For the circuit element 14, an active element such as a transistor and a diode, or a passive element such as a capacitor and a resistor can be adopted. An element having a large heat generation amount, such as a power semiconductor element, may be connected to the circuit board 16 with a heatsink made of metal interposed therebetween. Here, the active element or the like, which is mounted face up on the circuit board 16, is electrically connected to the conductive pattern 18 via a metal wire 15.

The conductive pattern 18 is made of metal such as copper, and is formed on the circuit board 16 so as to be insulated from the circuit board 16. Further, a pad 18A formed of the conductive pattern 18 is formed on a side from which leads 11 are extended. Here, a plurality of aligned pads 18A is provided on the vicinity of one side of the circuit board 16. Furthermore, the conductive pattern 18 is bonded to the surface of the circuit board 16 by means of the insulating layer 17 as an adhesive. In addition, there is shown the single-layered conductive pattern 18 in FIG. 1B. However, a multi-layered conductive pattern in which two or more layers are laminated may be formed.

The lead 11 is fixed to the pad 18A provided on the periphery of the circuit board 16. The lead 11 has a function of performing input and/or output between the device and outside, for example. Here, the multiplicity of leads 11 is provided on one side of the circuit board 16. The lead 11 is bonded to the pad 18A by means of a conductive adhesive material such as solder (a brazing material) or the like.

The sealing resin 12 is formed using either transfer molding employing thermosetting resin or injection molding employing thermoplastic resin. Here, the sealing resin 12 is formed in such a manner that the circuit board 16 and the electric circuit formed on the surface thereof are sealed, and the rear surface of the circuit board 16 is exposed out of the sealing resin 12.

The rear surface of the pad 18A may be separated from the surface of the circuit board 16 in a floating manner. The sealing resin 12 is filled in a gap between the separated pad 18A and the circuit board 16. The pad 18A is electrically connected to the conductive pattern 18 which is a portion other than the pad 18A. The lead 11 is mechanically supported by the sealing resin 12.

Referring to FIGS. 2 to 9, the method of manufacturing a hybrid integrated circuit device 10 will be described. The method of manufacturing the hybrid integrated circuit device 10 includes the steps of: forming an electric circuit including the conductive pattern 18 formed on a surface of a circuit board 16, and a circuit element 14 connected electrically to the conductive pattern 18; fixing a lead 11 to a pad 18A formed of the conductive pattern 18 disposed along one side of the circuit board 16; housing the circuit board 16 in a cavity 31 of molds 30, and fixedly supporting the lead 11 by clamping the lead 11 between the molds 30; and performing sealing by filling inside of the cavity 31 with sealing resin 12 with the rear surface of the circuit board 16 made in contact with an inside bottom surface of the molds 30. This manufacturing method will be described below.

Figure 2A:
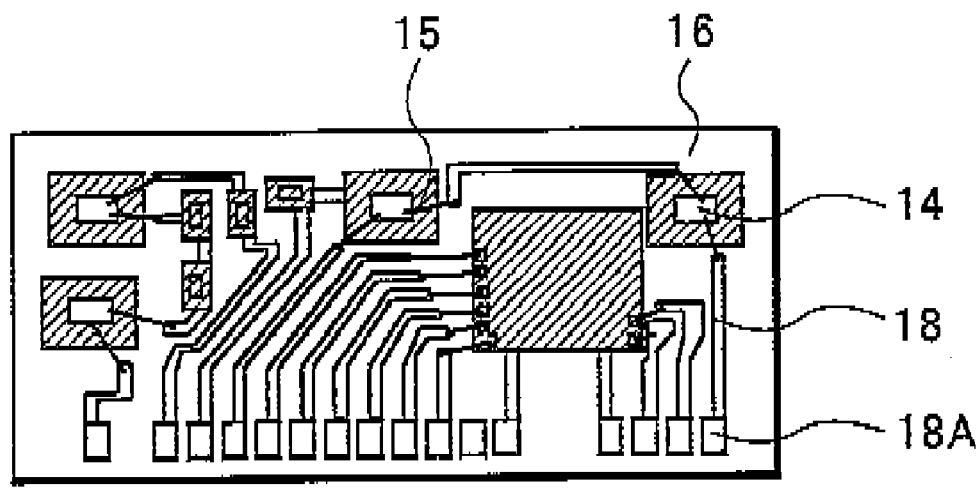
FIG. 2A is a plan view and FIG. 2B is a cross-sectional view showing the method of manufacturing the hybrid integrated circuit device of the preferred embodiment.
Figure 2B:
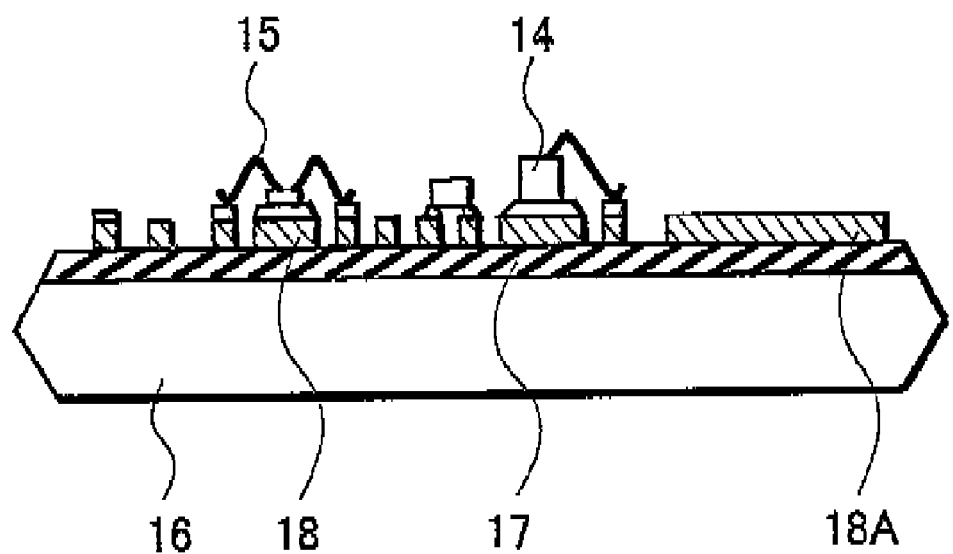

Firstly, referring to FIGS. 2A and 2B, an electric circuit including the conductive pattern 18 and the circuit element 14 is formed on the surface of the circuit board 16. For the method of manufacturing the conductive pattern 18, firstly, a conductive foil is bonded to the surface of the circuit board 16 with the insulating layer 17 interposed therebetween. This conductive foil is then etched, thereby obtaining the conductive pattern 18 having a desired pattern shape. In addition, the circuit element 14 is disposed on a desired spot of the conductive pattern 18, and is electrically connected thereto by use of metal wire 15. In this way, a desired electric circuit is formed. For the circuit element 14, an active element such as a semiconductor element, or a passive element such as a resistor and a capacitor can be generally adopted. In addition, an element such as a power semiconductor element, which is associated with large heat generation, may be fixed to the circuit board 16 with a heatsink or the like interposed therebetween.

Here, the insulating layer 17 has a function of insulating the conductive pattern 18 from the circuit board 16. The insulating layer 17 also has a function of bonding the conductive pattern 18 to the circuit board 16. For a material used for the insulating layer 17, a material obtained by mixing inorganic filler such as alumina with epoxy resin can be adopted. As described above, by adopting resin in which inorganic filler is filled as a material used for the insulating layer 17, thermal resistance is reduced when the heat generated in the circuit element 14 is conducted to the circuit board 16.

Figure 3:
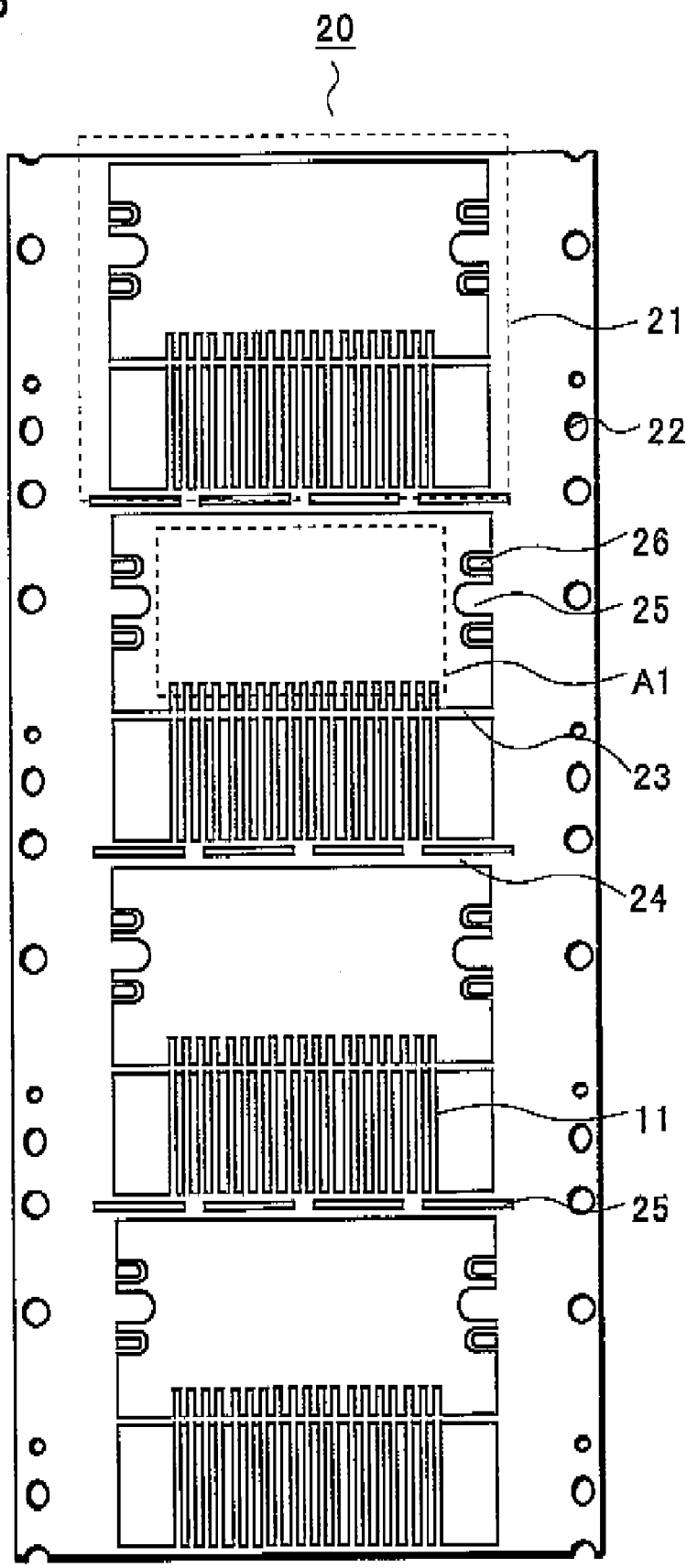
FIG. 3 is a plan showing the method of manufacturing the hybrid integrated circuit device of the preferred embodiment.

Next, referring to FIGS. 3 and 4, a description will be given of step of fixing the lead 11 to the circuit board 16. Firstly, referring to FIG. 3, the structure of a lead frame 20 will be described. In the preferred embodiment of the present invention, the lead 11 is supplied in the form of the lead frame 20. Specifically, a plurality of units 21 is formed in the lead frame 20 of this embodiment. Each of the unit 21 includes leads 11 and a region on which the circuit board 16 is mounted. The lead frame 20 has a lath-shaped form. The plurality of units 21 is disposed with the respective units 21 being separated from each other at predetermined intervals. Slits 25 are provided between the respective units 21. The slits 25 absorb thermal stress generated in a step such as molding step, where heating is performed. Moreover, guide holes 22 are provided on both peripheral portions in the longitudinal direction of the lead frame 20. The guide holes 22 are used for positioning in each step. In addition, the plurality of leads 11 provided for each of the units 21 is connected one another by means of a first connection portion 23 and a second connection portion 24, and thereby the shapes and positions thereof are fixed.

In each unit 21, a support portion 26 and a protrusion portion 25 are provided. The protrusion portion 25 is a portion extending inward from both edges of each unit 21. The protrusion portion 25 is formed such that the planar shape and position thereof become identical to that of a fixing portion 13 shown in FIG. 1A. The support portions 26 are embedded in the sealing resin in the step of resin sealing, which is performed later, and thereby the support portion 26 has a function of integrally connecting the circuit device and the lead frame 20 until the final step. The support portion 26 has a shape having a hole therein. The sealing resin is filled in the holes, thereby increasing bonding strength between the support portion 26 and the sealing resin. In addition, two of the support portions 26 are formed on each of the two facing sides in each unit 21. In this way, in a subsequent step, bonding between the circuit device and the lead frame 20 is strengthened. Moreover, since the hole is provided for the support portion 26 as described above, mechanical bonding between the support portion 26 and the lead frame 20 is reduced. Accordingly, it is made possible to easily separate the circuit device from the lead frame 20 in a subsequent step. The support portions 26 are formed in a region of the unit 21, which is other than a region A1 where the circuit board 16 is to be disposed. By disposing the support portions 26 as described above, it is made possible to prevent reduction in the moisture resistance of the circuit device, which is caused by embedding the support portions 26 in the sealing resin.

Figure 4A:
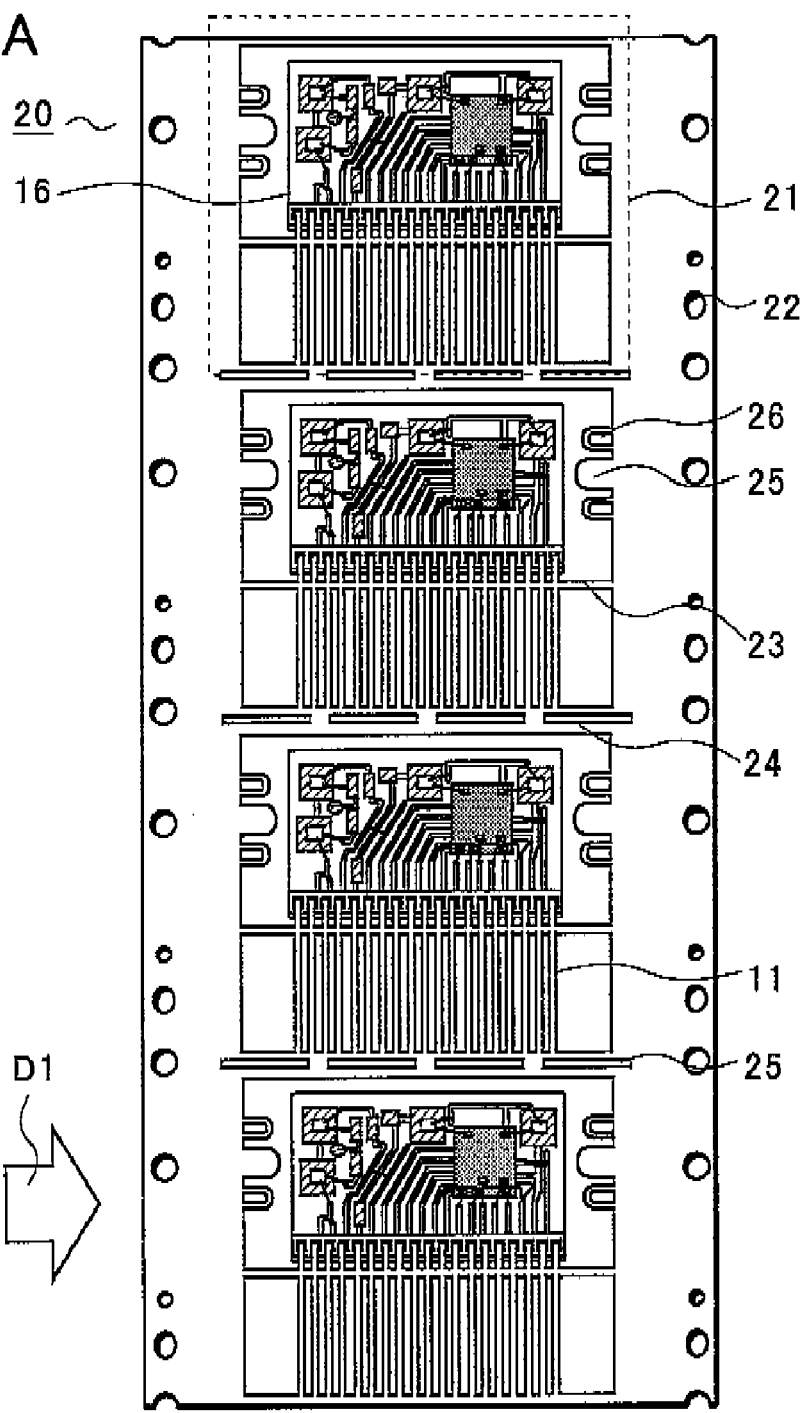
FIG. 4A is a plan view and FIG. 4B is a cross-sectional view showing the method of manufacturing the hybrid integrated circuit device of the preferred embodiment.
Figure 4B:
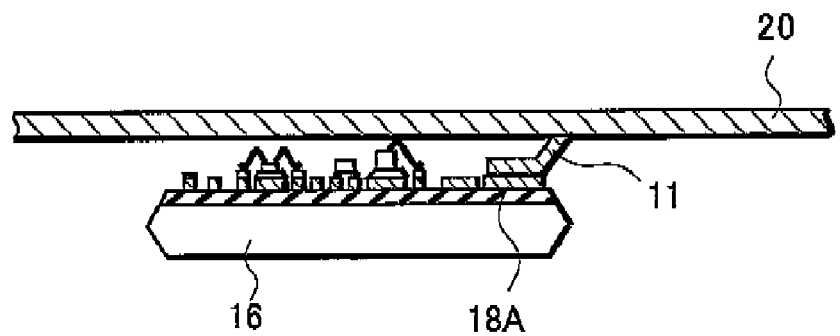

Next, referring to FIGS. 4A and 4B, here, the circuit board 16 is fixed to each of the units 21 of the lead frame 20. FIG. 4A is a plan view showing this step. FIG. 4B is a cross-sectional view seen from the cross-sectional direction D1. Tip portions of the leads 11 of each unit 21 are fixed to the pads 18A on the circuit board 16 by means of a brazing material such as solder. Thereby, the circuit board 16 and the lead frame 20 are fixed to each other. Referring to FIG. 4B, here, part of the lead 11, which is fixed to the pad 18A, is bent for the purpose of preventing a short circuit with the circuit board 16.

Next, referring to FIGS. 5 to 8, sealing is performed employing the sealing resin 12 with the rear surface of the circuit board 16 being exposed to the outside. Firstly, referring to FIGS. 5A and 5B, the circuit board 16 is housed inside of the molds 30, where sealing is performed. FIGS. 5A and 5B are cross-sectional views showing this step. A description will be given herein of the method of sealing one piece of the circuit board 16. However, in reality, this step is performed in a state where a plurality of circuit board 16 is connected with the lead frame 20.

Figure 5A:
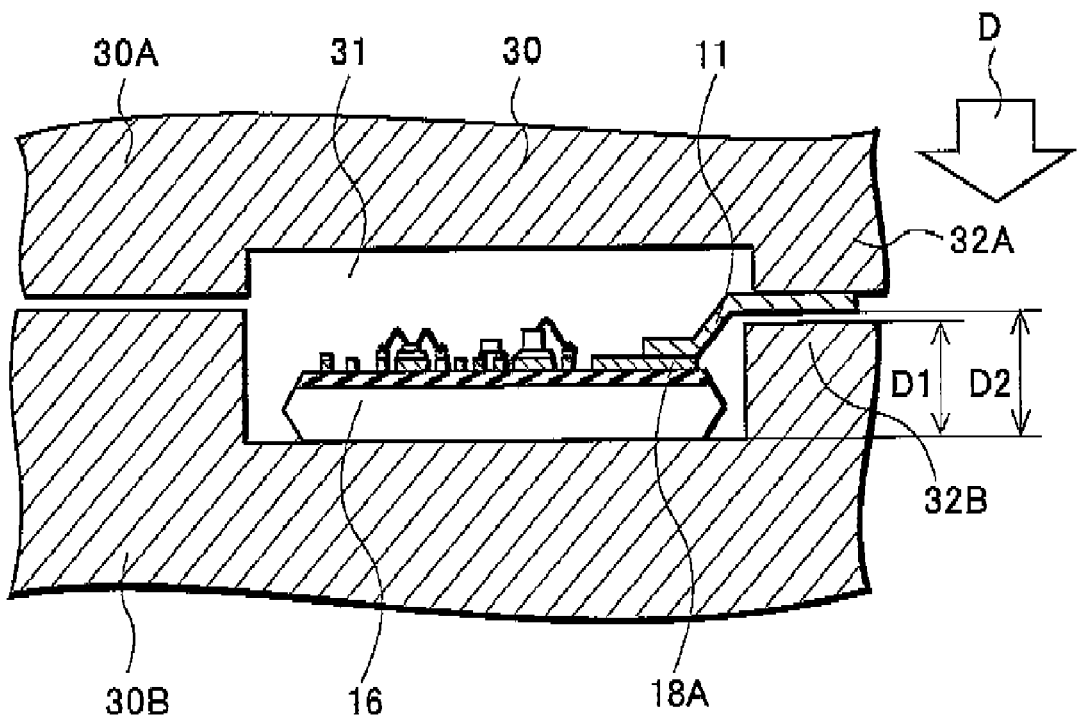
FIGS. 5A and 5B are cross-sectional views showing the method of manufacturing the hybrid integrated circuit device of the preferred embodiment.

Firstly, referring to FIG. 5A, a description will be given of a related configuration of the molds 30 in which sealing is performed, and the circuit board 16. The molds 30, in which sealing is performed in this step, include an upper mold 30A and a lower mold 30B. The upper and lower molds 30A and 30B are interlocked with each other in vertical direction, thereby forming a cavity 31 in which sealing is performed. In addition, the upper and lower molds 30A and mold 30B are provided with a contact portion 32A and a contact portion 32B, respectively. These contact portions 32 support the leads 11 by clamping the leads 11 therebetween, and a planar position of the circuit board 16 is fixed. FIG. 5A shows a state where the circuit board 16 is mounted on the lower mold 32B, and thereafter the upper mold 30A is allowed to come into contact with the lower mold 30B. Here, the distance in a vertical direction between the lower surface of the cavity 31 and the top edge of the contact portion 32B of the lower mold 30B is defined as D1. The distance in a vertical direction between the rear surface of the circuit board 16 and the rear surface of the lead 11 is defined as D2. Accordingly, it can be seen that, in the present embodiment, the distance D1 is set to be shorter than the distance D2. If the circuit board 16 is placed onto the inner upper surface of the lower mold 30B, a gap corresponding to a difference between the distances D1 and D2 is formed between the lead 11 and the contact portion 32B.

Figure 5B:
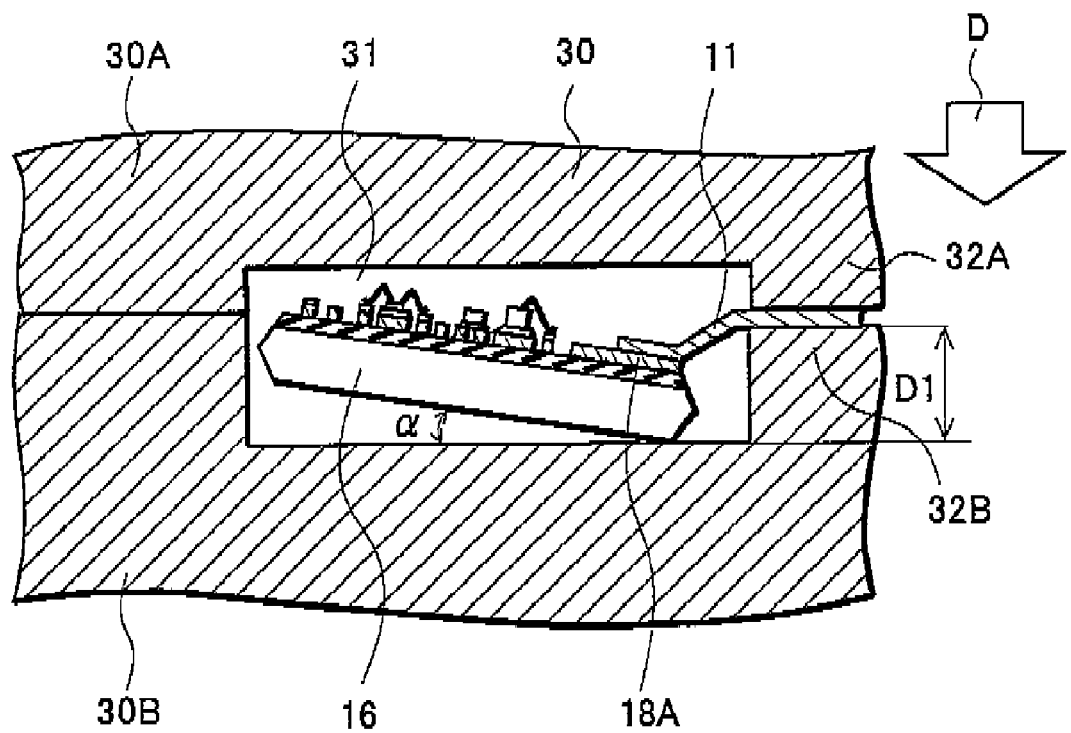

Referring to FIG. 5B, here, the upper mold 30A is pressed down in the pressing direction D until the lead 11 comes into contact with the contact portion 32B. Thus, in the cavity 31, the circuit board 16 is fixed in a direction oblique with respect to the lower surface of the cavity 31. In other words, the circuit board 16 is fixed in an oblique direction by rotating about the edge to which the lead 11 is fixed. This is caused by the following reason: since the lead 11 is extended through an inclined portion, when the contact portion 32A presses the tip portion of the lead 11 in the downward direction, the circuit board 16 undergo forces which cause the circuit board 16 to be pressed in the downward direction and in the back and forth directions (right and left directions in this drawing). Here, the angle which the lower surface of the cavity 31 forms with the circuit board 16 is defined as α.

Figure 6A:
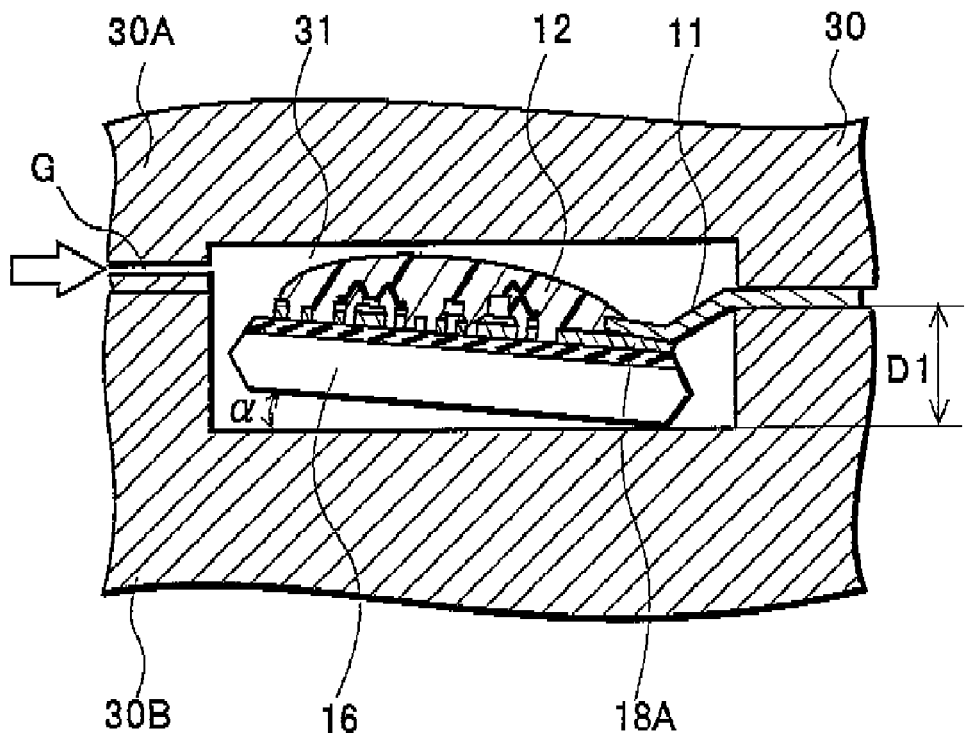
FIGS. 6A and 6B are cross-sectional views showing the method of manufacturing the hybrid integrated circuit device of the preferred embodiment.
Figure 6B:
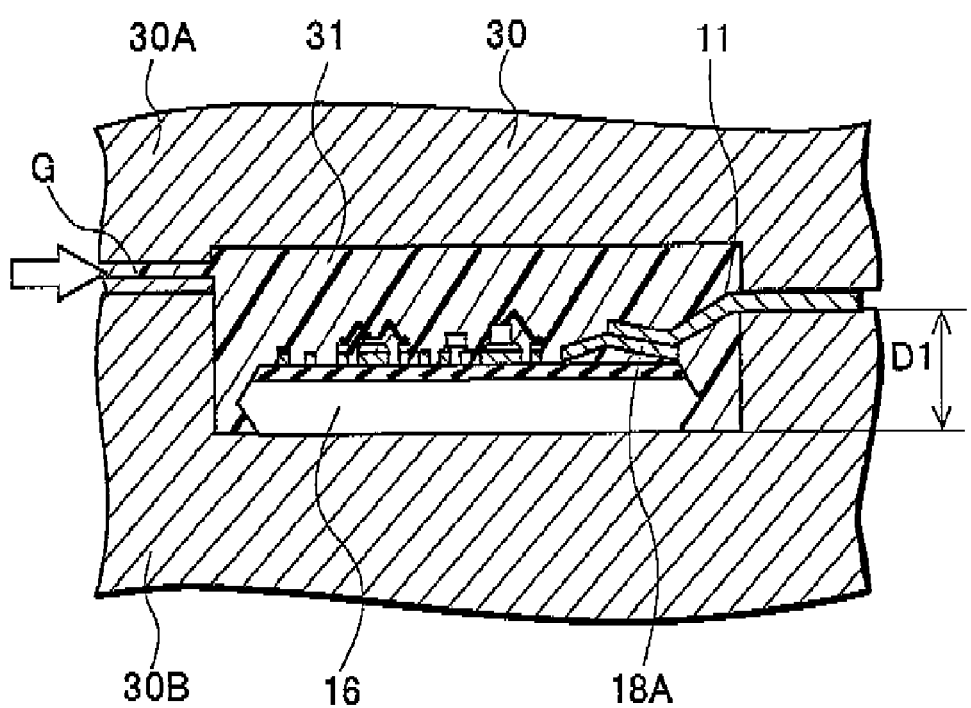

Next, referring to FIGS. 6A and 6B, here, the sealing resin 12 is filled in the cavity 31. FIG. 6A is a cross-sectional view showing a state of this step, where the sealing resin 12 is being filled in the cavity 31. FIG. 6B is a cross-sectional view showing a state after the step of resin sealing is performed.

Referring to FIG. 6A, here, molding is performed by filling the cavity 31 with the sealing resin 12 through a gate G. Further, in this step, the sealing resin 12 is placed onto the circuit board 16, and thereby the weight of the sealing resin 12 allows the rear surface of the circuit board 16 to come in contact with the lower surface of the cavity 31. Specifically, as the step of resin sealing proceeds, the amount of the sealing resin 12 placed onto the circuit board 16 gradually becomes larger, and thus the angle α which the lower surface of the cavity 31 forms with the circuit board 16 becomes smaller. Eventually, the rear surface of the circuit board 16 is made in contact with the lower surface of the cavity 31. Moreover, the sealing pressure, which is generated when the sealing resin 12 is filled into the cavity 31, also serves to press the circuit board 16 in the downward direction.

The gate G is provided in a spot of a side of the mold 30, the spot being positioned above the upper surface of the circuit board 16. In FIGS. 6A and 6B, the gate G is provided in the side opposite to the side to which the leads 11 are fixed. However, the gate G may be provided in a side of the mold positioned in the depth direction of the plane of paper.

Referring to FIG. 6B, sealing is performed until the cavity 31 is filled with the sealing resin 12. Thus, the molding step is finished. Through the sealing step, the rear surface of the circuit board 16 comes into contact with the lower surface of the cavity 31. Accordingly, the rear surface of the circuit board 16 takes an exposed structure out of the sealing resin 12. Further, this step is performed after the entire of the molds 30 is heated to around 180° C. Furthermore, in some cases, the rear surface of the pad 18A is separated from the surface of the circuit board 16 before the rear surface of the circuit board 16 is made in contact with the lower surface of the cavity 31.

Figure 7:
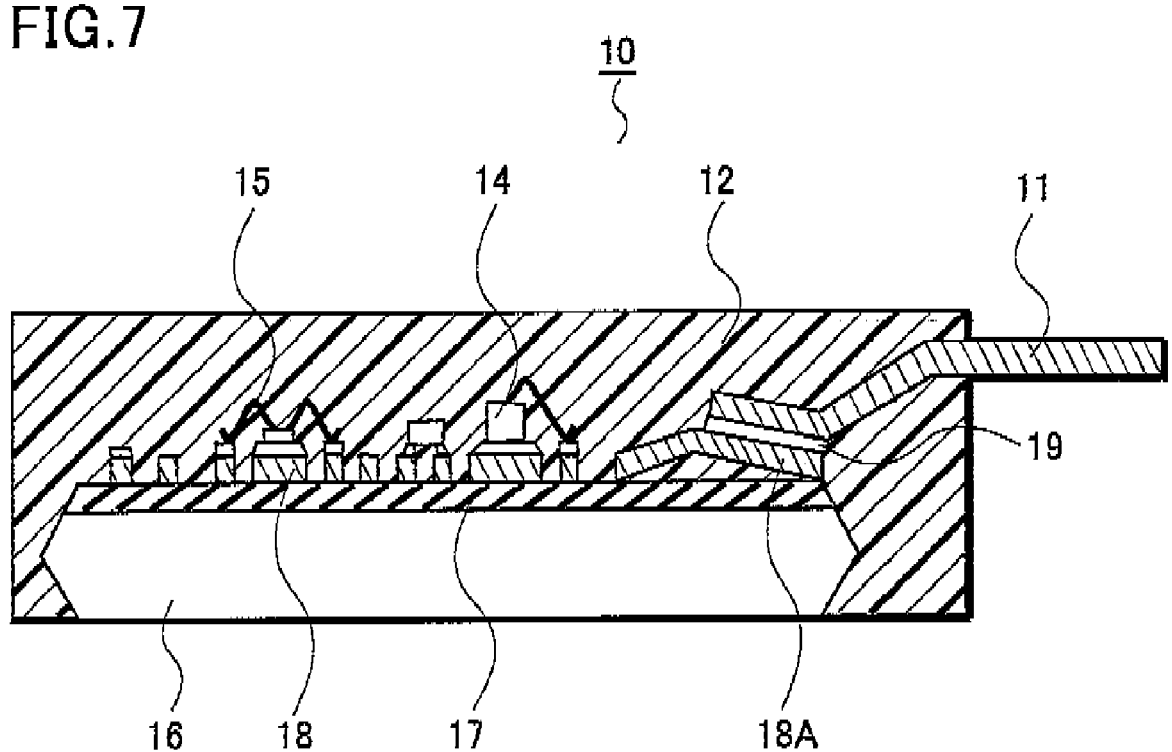
FIG. 7 is a cross-sectional view showing the method of manufacturing the hybrid integrated circuit device of the preferred embodiment.

Next, referring to FIG. 7, which is a cross-sectional view, a description will be given of the configuration of the hybrid integrated circuit device 10 after the molding step is finished. Referring to FIG. 7, here, the rear surface of the pad 18A is partially separated from the circuit board 16. The front surface of the pad 18A is fixed to the lead 11 with a brazing material 19 interposed therebetween. The stress which is caused by the varying of angle α in the above-described molding step is absorbed because the rear surface of the pad 18A is separated from the circuit board 16, the angle α being formed by the lower surface of the cavity 31 and the circuit board 16. In the present embodiment, bonding strength between the pad 18A and the circuit board 16 is set to be smaller than that between the pad 18A and the lead 11, thereby realizing the above-described configuration. In addition, the sealing resin 12 is filled in a gap between the separated pad 18A and the circuit board 16.

Specifically, the rear surface of the pad 18A is bonded to the surface of the circuit board 16 with the insulating layer 17 interposed therebetween. The front surface of the pad 18A is bonded to the lead 11 with the brazing material 19 interposed therebetween. The bonding strength of the brazing material 19 is higher than that of the insulating layer 17. Accordingly, when an external force to separate the pad 18A is exerted in the molding step, the rear surface of the pad 18A preferentially becomes separated. Moreover, in the molding step, the inside of the cavity 31 is heated to around 180° C. Under such a circumstance, the insulating layer 17 which bonds the pad 18A to the circuit board 16 softens up, and thereby the bonding strength thereof is reduced. By contrast, the brazing material 19 which bonds the pad 18A to the lead 11 does not soften up at such temperature. Accordingly, it is possible to easily obtain such a structure as shown in FIG. 7.

The rear surface of the pad 18A becomes separated from the circuit board 16 by separating the rear surface of the pad 18A from the circuit board 16. However, a portion of the lead 11, around which the circuit board 16 is connected, is embedded in the sealing resin 12 which seals entire of the circuit board 16. For this reason, the lead 11 is mechanically supported by the sealing resin 12. In addition, the lead 11 is electrically connected to the circuit board 16 via the pad 18A.

By performing the above-described step, a portion of the conductive pattern 18, which is continuous with the pad 18A, extends to some extent. However, when copper is used as the material for the conductive pattern 18, the excellent ductility of copper will preclude the possibility of break and the like in the conductive pattern 18, which may be caused by this extension. Furthermore, the rear surface of the pad 18A is separated from the insulating layer 17 in FIG. 7. However, the pad 18A may be separated from the circuit board 16 in a state where the insulating layer 17 is bonded to the rear surface of the pad 18A.

Figure 8:
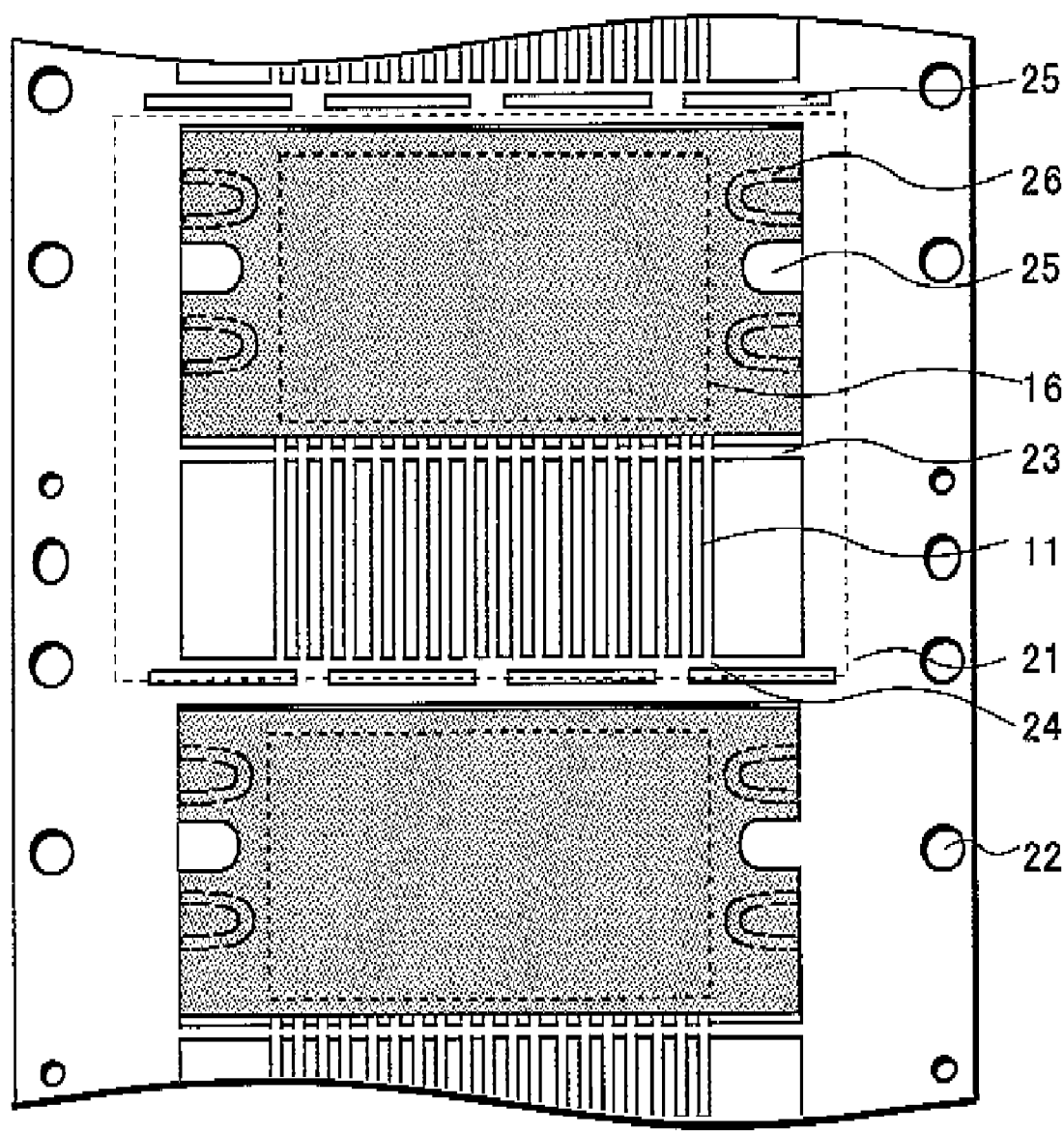
FIG. 8 is a plan view showing the method of manufacturing the hybrid integrated circuit device of the preferred embodiment.

Referring to FIG. 8, a description will be given of the planar state of the lead frame 20 after the molding step is finished. FIG. 8 is a plan view showing an enlarged part of the lead frame 20 shown in FIG. 3.

The sealing resin is formed so as to seal the circuit board 16 fixed to each unit 21. The sealing resin 12 is not formed in spots corresponding to regions of the protrusion portions 25. Therefore, these spots become the fixing portions 13 as shown in FIG. 1A. Moreover, the support portions 26 are embedded in the sealing resin 12 in the molding step. In FIG. 8, the support portions 26 embedded in the sealing resin are indicated by dotted lines.

Figure 9:
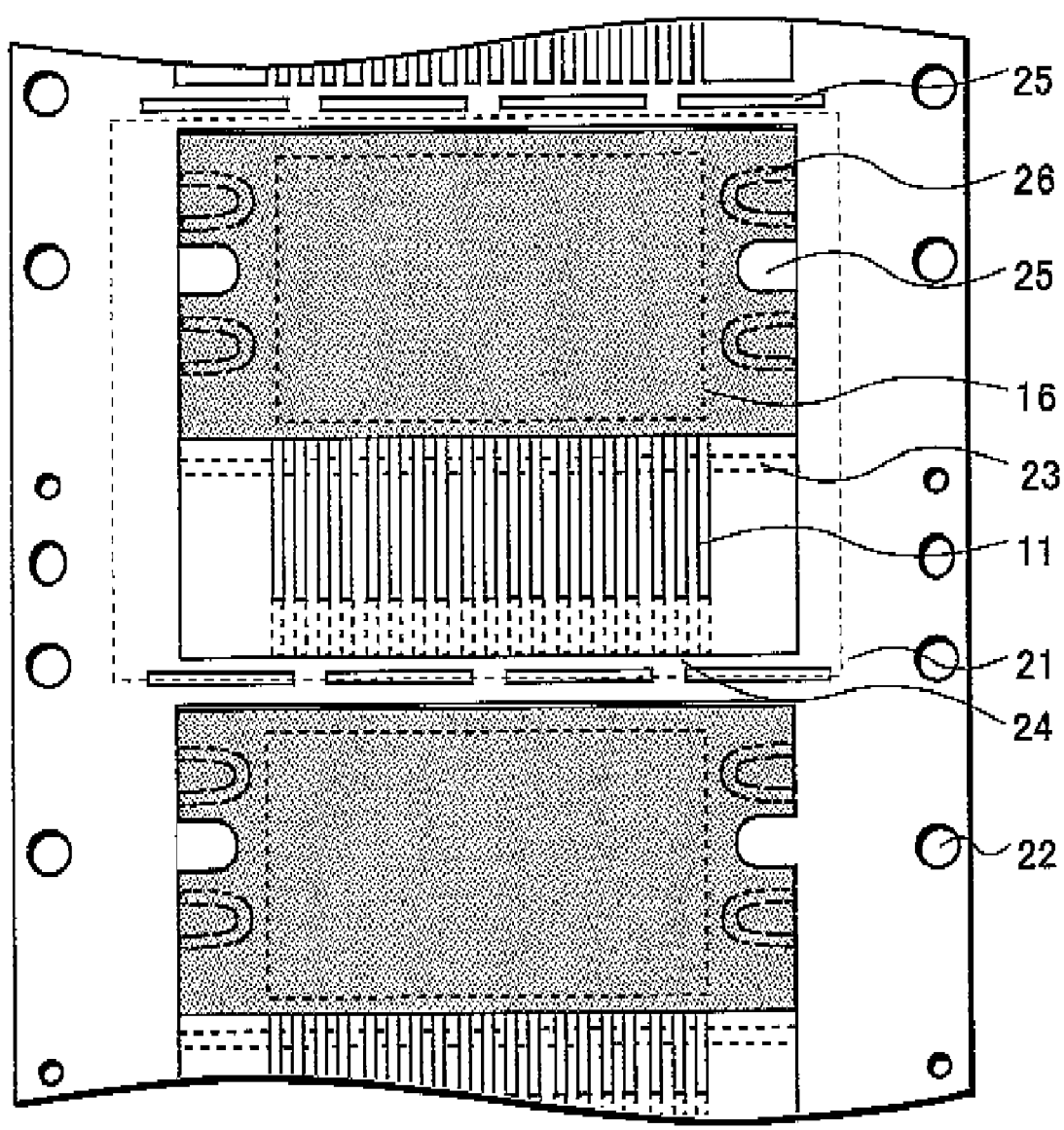
FIG. 9 is a plan view showing the method of manufacturing the hybrid integrated circuit device of the preferred embodiment.
Figure 10A:
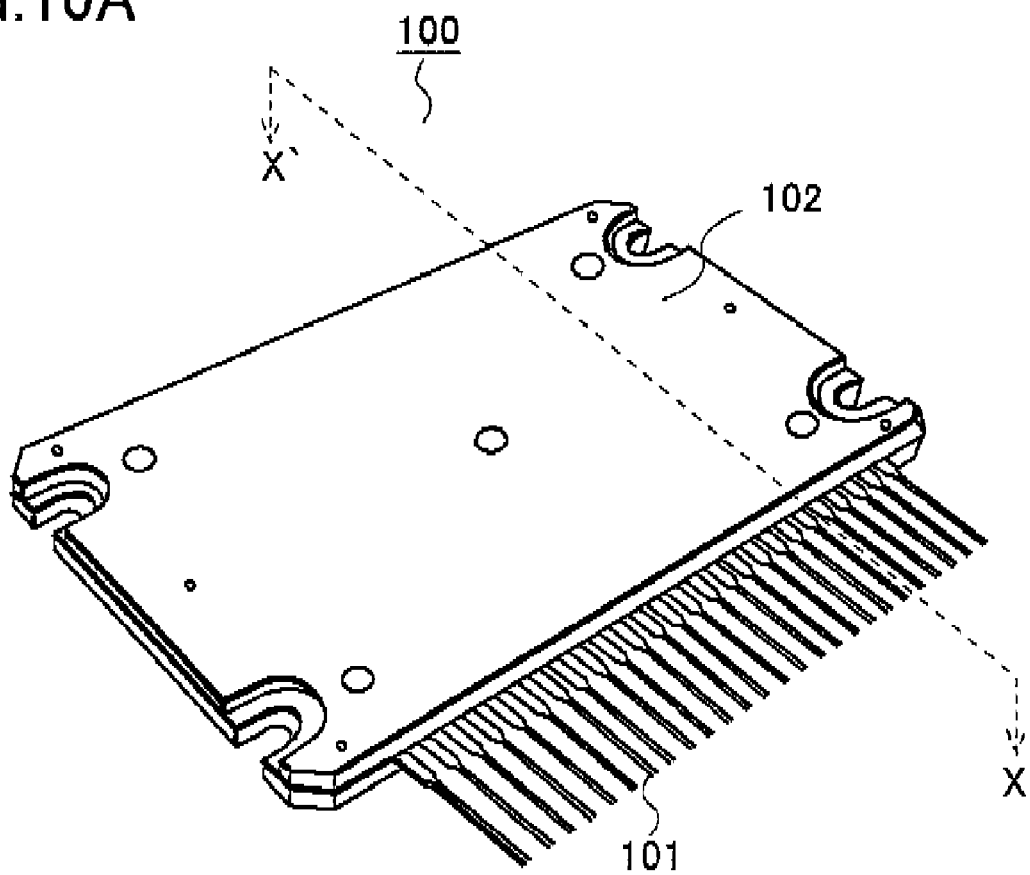
FIG. 10A is a perspective view and FIG. 10B is a cross-sectional view showing a conventional hybrid integrated circuit device.
Figure 10B:
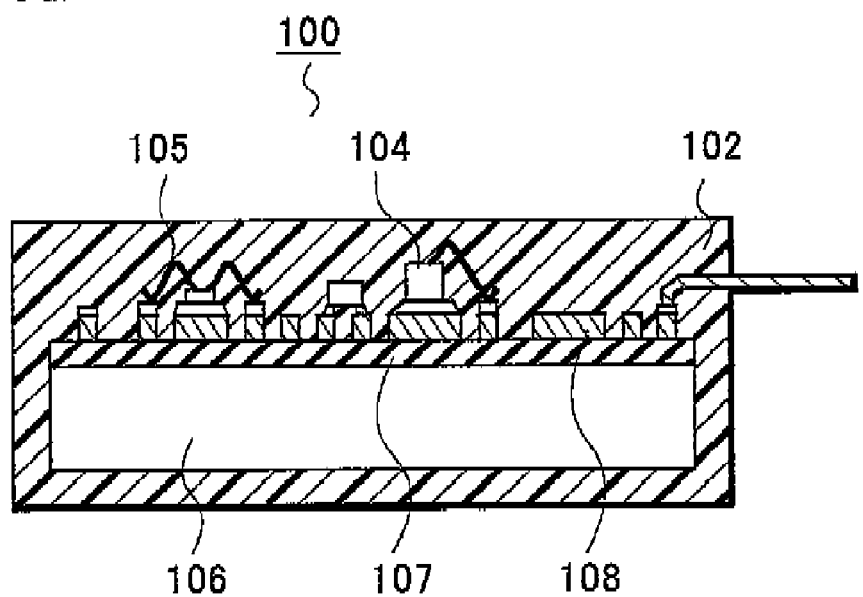
Figure 11:
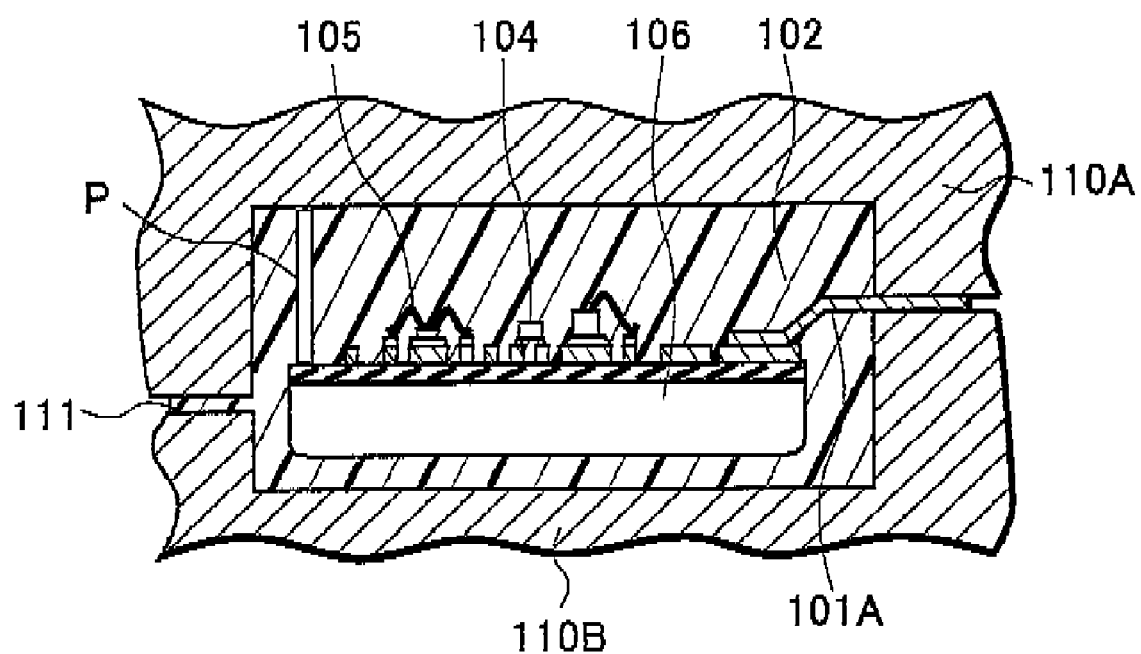
FIG. 11 is a cross-sectional view showing the method of manufacturing the conventional hybrid integrated circuit device.

Next, referring to FIG. 9, the leads 11 are separated from each unit 21. Here, the first connection portion 23 indicated by dotted lines is removed by a removal method such as punching, and the respective leads 11 are mechanically and electrically separated. In addition, portions of the leads 11, which are continuous with the second connection portion 24, are cut off to separate the leads 11 from the lead frame 20. By mechanically separating the leads 11 from the lead frame 20, the resin-sealed circuit board 16 and the lead frame 20 are connected to each other via the support portions 26. Accordingly, in this embodiment, even after the leads 11 are separated, the hybrid integrated circuit device in each unit 21 and the lead frame 20 are integrally supported. In this way, this embodiment has an advantage that transport and the like between the steps can be easily performed.

After the above-described step is finished, the hybrid integrated circuit device 10 as shown in FIG. 1A, for example, is completed through a step of performing forming by bending the lead 11 in a desired shape, a step of separating each hybrid integrated circuit device from the lead frame 20, and a step of measuring electrical characteristics of each hybrid integrated circuit device.

What is claimed is:

1. A method of manufacturing a hybrid integrated circuit device, comprising: forming an electric circuit which includes a conductive pattern formed on a surface of a circuit board and a circuit element electrically connected to the conductive pattern; fixing a lead to a pad formed of the conductive pattern; housing the circuit board in a cavity of molds, and fixedly supporting the lead by clamping the lead between the molds; and performing sealing by filling inside of the cavity with sealing resin with the rear surface of the circuit board made in contact with an inside bottom surface of the molds, wherein, in the step of fixing the lead, the lead is supported by clamping the lead between the molds and thereby the circuit board is fixed in a direction oblique with respect to the inside bottom surface of the molds, and the weight of the sealing resin and pressure are used to allow the rear surface of the circuit board to come in contact with the inside bottom surface of the molds.

2. The method of manufacturing a hybrid integrated circuit device according to claim 1, wherein a rear surface of the pad is bonded to the circuit board via a first adhesive, the lead is bonded to a surface of the pad via a second adhesive which has a higher bonding strength than that of the first adhesive, and the weight of the sealing resin and pressure are used to allow the rear surface of the circuit board to come in contact with the inside bottom surface of the molds, and thereby the rear surface of the pad is separated from the circuit board in a state where the front surface of the pad is bonded to the lead.

3. The method of manufacturing a hybrid integrated circuit device according to claim 2, wherein the first adhesive is an adhesive having insulating properties, and the second adhesive is a conductive adhesive.

4. The method of manufacturing a hybrid integrated circuit device according to claim 2, wherein the first adhesive is an adhesive which includes a resin, and the second adhesive is an adhesive which is made of metal.

5. The method of manufacturing a hybrid integrated circuit device according to claim 2, wherein the first adhesive for bonding the rear surface of the pad to the circuit board is made of a material which softens up at temperature lower than that of the molds when the sealing is performed, the circuit board is placed inside the molds, thereby leading to the softening up of the first adhesive, and the bonding strength of the first adhesive is reduced, and the weight of the sealing resin and pressure are used to allow the rear surface of the circuit board to come in contact with the inside bottom surface of the molds, and thereby the rear surface of the pad is separated from the circuit board in a state where the front surface of the pad is bonded to the lead.

6. The method of manufacturing a hybrid integrated circuit device according to claim 5, wherein the first adhesive is an adhesive which includes a resin.

7. The method of manufacturing a hybrid integrated circuit device according to claim 2, wherein the sealing resin is filled in a gap between the separated pad and the circuit board.

* * * * *